United States Patent Office 3,159,579

Patented Dec. 1, 1964

3,159,579

THERMOELECTRIC MATERIALS

John B. Conn, Westfield, N.J., assignor to Merck & Co., Inc., Rahway, N.J., a corporation of New Jersey No Drawing. Filed June 25, 1962, Ser. No. 205,102
3 Claims. (Cl. 252—62.3)

This invention relates to thermoelectric materials and more particularly to thermoelectric alloys having physical properties useful in thermoelectric devices.

It is known in the art that thermoelectric materials offer considerable promise in device application, particularly in cooling and power generating devices. For example, when two wires of dissimilar thermoelectric compositions have their ends joined so as to form a continuous loop, a pair of junctions is established by the respective ends so joined. If the two junctions are at different temperatures, an electromotive force will be set up in the circuit thus formed. This effect is called the thermoelectric or Seebeck effect and the device is called a thermocouple. This effect may be used as a means for making batteries or generators.

Thermoelectric materials may be classified as either n-type or p-type depending upon the direction of current flow across the cold junction formed by the thermoelectric material and another element when operating as a thermoelectric generator according to the Seebeck effect. If the positive current direction at the cold junction is from the thermoelectric material, then it is termed a p-type thermoelectric material. Conversely, if the positive current direction is from the cold junction and toward the thermoelectric material, it is termed an n-type thermoelectric material.

There are several fundamental requirements for desirable thermoelectric materials. One requirement is a high electromotive force per degree of temperature difference between the junctions. This is referred to as the thermoelectric power of the material and is measured in terms of a Seebeck coefficient. The requisite is high electrical conductivity or, conversely low electrical resistivity. This is apparent since the temperature between junctions will not be great if the current passing through the circuit generates high Joulean heat.

An object of the present invention is to provide novel thermoelectric materials having useful thermoelectric properties.

Another object of the invention is to provide p-type thermoelectric materials having useful physical properties.

Other objects will be made apparent from the following more detailed description of the invention.

The p-type thermoelectric materials of the present invention have the general formula:

$$x\text{CuSbSe}_2.(1-x)\text{Cu}_3\text{SbSe}_4$$

where $x$ is greater than zero, but less than one. In a preferred form $x$ ranges from about 0.1 to about 0.5 with $x$=0.5 representing a more nearly optimum compound.

The thermoelectric compounds of the present invention may be prepared by reacting at elevated temperatures a mixture of the elemental constituents of the compound in proportions corresponding to the desired composition. For example, to prepare $Cu_2SbSe_3$ ($x$=0.50), pure copper (13.082 g.), antimony (12.534 g.), and selenium (24.385 g.) are placed in a quartz ampoule which has been coated inside with pyrolytically deposited carbon. The vessel is evacuated to 1 micron pressure, then sealed and heated in a horizontal furnace at 800° with occasional rocking until the contents are completely molten and homogenized. The ingot, after cooling, is broken up and transferred to a casting tube consisting of uncoated quartz having an internal diameter of 7 mm. The crushed solid is melted down to an ingot with an oxy-hydrogen torch, then zone-leveled with 5 passes at 4 inches per hour, while maintaining an over-all temperature ambient of 400°. After completion of the zoning, the ingot is cooled to room temperature over a period of 24 hours.

In a manner analogous to that described in detail above and using collective amounts of the elements for a charge of 50.000 g. Other alloys in which $x$=0.33, 0.25, 0.15, 0.10, 0.05 are prepared. The properties of the above prepared alloys are compared in the table below with those of the parent compounds in which $x$=1 and $x$=0.

*Table I*

PROPERTIES OF THERMOELECTRIC ALLOYS $x\text{CuSbSe}_2.(1-x)\text{Cu}_3\text{SbSe}_4$

| $x$ (Mole Fraction) | Seebeck Coefficient μv./K.° | Resistivity (ohm-cm.) |
|---|---|---|
| 1.00 | +510 | 1.4 |
| 0.50 | +400 | 0.100 |
| 0.33 | +278 | 0.012 |
| 0.25 | +295 | 0.024 |
| 0.15 | +308 | 0.056 |
| 0.10 | +222 | 0.006 |
| 0.05 | +295 | 0.031 |
| 0.00 | +224 | 0.045 |

As will be observed from the experimental results shown in the table above, the combination of a high Seebeck coefficient with a low resistivity is achieved in the range of about 0.1 to about 0.5. The preferred ranges $x$=.1, $x$=.5.

While the invention has been described with particular reference to certain embodiments thereof, it will be readily understood by those skilled in the art that various substitutes may be made without departing from the spirit and scope of the invention.

What is claimed is:

1. p-Type thermoelectric materials having useful thermoelectric properties with the general formula $$x\text{CuSbSe}_2.(1-x)\text{Cu}_3\text{SbSe}_4$$

where $x$ is greater than zero, but less than one.

2. A p-type thermoelectric material having useful thermoelectric properties with the general formula $$x\text{CuSbSe}_2.(1-x)\text{Cu}_3\text{SbSe}_4$$

where $x$ is 0.5.

3. A p-type thermoelectric material having useful thermoelectric properties with the general formula $$x\text{CuSbSe}_2.(1-x)\text{Cu}_3\text{SbSe}_4$$

where $x$ is 0.1.

References Cited in the file of this patent

UNITED STATES PATENTS

| | | |
|---|---|---|
| 2,882,469 | Wernick | Apr. 14, 1959 |
| 2,882,470 | Wernick | Apr. 14, 1959 |
| 2,902,529 | Busanovich | Sept. 1, 1959 |
| 3,095,330 | Epstein et al. | June 25, 1963 |